(12) United States Patent
Lin et al.

(10) Patent No.: US 8,912,942 B2
(45) Date of Patent: Dec. 16, 2014

(54) SUCCESSIVE-APPROXIMATION-REGISTER ANALOG-TO-DIGITAL CONVERTER (SAR ADC) AND METHOD THEREOF

(71) Applicant: Realtek Semiconductor Corp., HsinChu (TW)

(72) Inventors: Jian-Ru Lin, HsinChu (TW); Shih-Hsiun Huang, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 14/183,637

(22) Filed: Feb. 19, 2014

(65) Prior Publication Data

US 2014/0327560 A1 Nov. 6, 2014

(30) Foreign Application Priority Data

May 3, 2013 (TW) .............................. 102115940 A

(51) Int. Cl.
*H03M 1/12* (2006.01)
*H03M 1/46* (2006.01)
(52) U.S. Cl.
CPC ...................................... *H03M 1/46* (2013.01)
USPC ............................ 341/172; 341/155; 341/163

(58) Field of Classification Search
CPC ........... H03M 1/14; H03M 1/34; H03M 1/38; H03M 1/46; H03M 1/462; H03M 1/466; H03M 1/468
USPC .......................................... 341/172, 163, 155
See application file for complete search history.

(56) References Cited

U.S. PATENT DOCUMENTS

| | | | | |
|---|---|---|---|---|
| 7,773,012 | B2 * | 8/2010 | Yoshinaga | 341/120 |
| 8,031,099 | B2 * | 10/2011 | Zhao et al. | 341/150 |
| 8,344,925 | B1 * | 1/2013 | Evans | 341/155 |
| 8,378,863 | B2 * | 2/2013 | Ishikawa | 341/118 |
| 8,717,221 | B2 * | 5/2014 | Jeon et al. | 341/172 |

* cited by examiner

*Primary Examiner* — Khai M Nguyen
(74) *Attorney, Agent, or Firm* — McClure, Qualey & Rodack, LLP

(57) ABSTRACT

A SAR ADC and a method thereof are provided. Particularly, in each bit determining duration of last several bit determining durations, a comparer is used to consecutively compare a first potential with a second potential on a sampling and digital-to-analog converting circuit a plurality of times to obtain a plurality of comparison results, and then an SAR control circuit generates a corresponding output bit according to the obtained plurality of comparison results.

19 Claims, 12 Drawing Sheets

US 8,912,942 B2

SUCCESSIVE-APPROXIMATION-REGISTER ANALOG-TO-DIGITAL CONVERTER (SAR ADC) AND METHOD THEREOF

CROSS-REFERENCES TO RELATED APPLICATIONS

This non-provisional application claims priority under 35 U.S.C. §119(a) on Patent Application No. 102115940 filed in Taiwan, R.O.C. on 2013 May 3, the entire contents of which are hereby incorporated by reference.

BACKGROUND

1. Technical Field

The present invention relates to an analog-to-digital conversion technology, and more particularly to a successive-approximation-register (SAR) analog-to-digital converter (ADC) and a method thereof.

2. Related Art

An ADC is of various architectures, such as: a flash ADC, a pipelined ADC, and an SAR ADC. These architectures have respective advantages, and are generally selected according to different application demands. Compared with other architectures, the SAR ADC is lower in power consumption, smaller in area and lower in cost.

Conventionally, an SAR ADC obtains a digital output code matching an input signal by adopting a binary search algorithm. In a converting procedure, according to a comparison result of a comparer each time, in a digital-to-analog converting circuit in the SAR ADC, a binary scaled voltage generally needs to be added or subtracted, and after a last bit cycle ends, the difference between an input signal and a reference voltage is less than a least significant bit (LSB). However, when the input signal is small, the input signal is easily subjected to interference of a noise (this interference includes interference of the comparer, interference of a chip system itself, and interference of a power source), and thus there is occurrence of misjudgment in the converting procedure.

SUMMARY

In an embodiment, an SAR analog-to-digital converting method includes: generating a first potential by sampling an analog signal; generating a plurality of output bits sequentially according to the first potential and a plurality of second potentials occurring consecutively on the digital-to-analog converting circuit by using a comparer; and outputting a digital signal based on these output bits. Here, these second potentials correspond to these output bits respectively. A step of generating a last output bit includes: comparing the first potential with a second potential occurring at the last time a plurality of times consecutively by using the comparer, so as to obtain a plurality of first comparison results; and generating the last output bit according to these first comparison results.

In another embodiment, an SAR analog-to-digital converting method includes: generating a first potential by sampling an analog signal; generating a plurality of output bits sequentially according to the first potential and a plurality of second potentials occurring consecutively on the digital-to-analog converting circuit by using a comparer; and outputting a digital signal based on these output bits. A step of generating last j output bits of these output bits includes: comparing the first potential with a second potential occurring at the last time a plurality of times consecutively by using the comparer, so as to obtain a plurality of first comparison results respectively; and generating last j output bits according to these first comparison results. Here, j is an integer greater than 1.

In still another embodiment, an SAR ADC includes: a sampling and digital-to-analog converting circuit, a comparer and an SAR control circuit. The SAR control circuit includes: a first determining module, at least one second determining module and an output logic. The first determining module is corresponding to a last bit determining duration of a plurality of bit determining durations, and each second determining module is corresponding to one of the rest bit determining durations.

The sampling and digital-to-analog converting circuit generates a first potential by sampling an analog signal. In the last bit determining duration, the comparer compares the first potential with a second potential on the sampling and digital-to-analog converting circuit a plurality of times consecutively to obtain a plurality of first comparison results respectively, and the first determining module generates a group of last output bits according to these first comparison results. In each bit determining duration of the rest bit determining durations, the comparer compares the first potential with the second potential once to obtain a corresponding second comparison result, and the corresponding second determining module generates an output bit according to the corresponding second comparison result, and controls the sampling and digital-to-analog converting circuit according to the corresponding second comparison result, so as to adjust the second potential on the sampling and digital-to-analog converting circuit. The output logic outputs a digital signal according to at least one output bit and the group of last output bits.

To summarize, according to the SAR ADC and the method thereof of the present invention, the number of comparison times of the comparer is increased in the last several bit determining durations, so under the situation that no complex signal detecting apparatus is added, the influence of a noise (such as: noise interference generated by the comparer, a chip system itself, or a power source), on the signal-to-noise ratio (SNR) of the SAR ADC is effectively reduced. Additionally, for results of a plurality of comparison times, the energy of the noise may be further reduced in a manner of majority decision, averaging and round-off or specific encoding.

BRIEF DESCRIPTION OF THE DRAWINGS

The present invention will become more fully understood from the detailed description given herein below for illustration only, and thus not limitative of the present invention, wherein.

DETAILED DESCRIPTION

Figure 1:
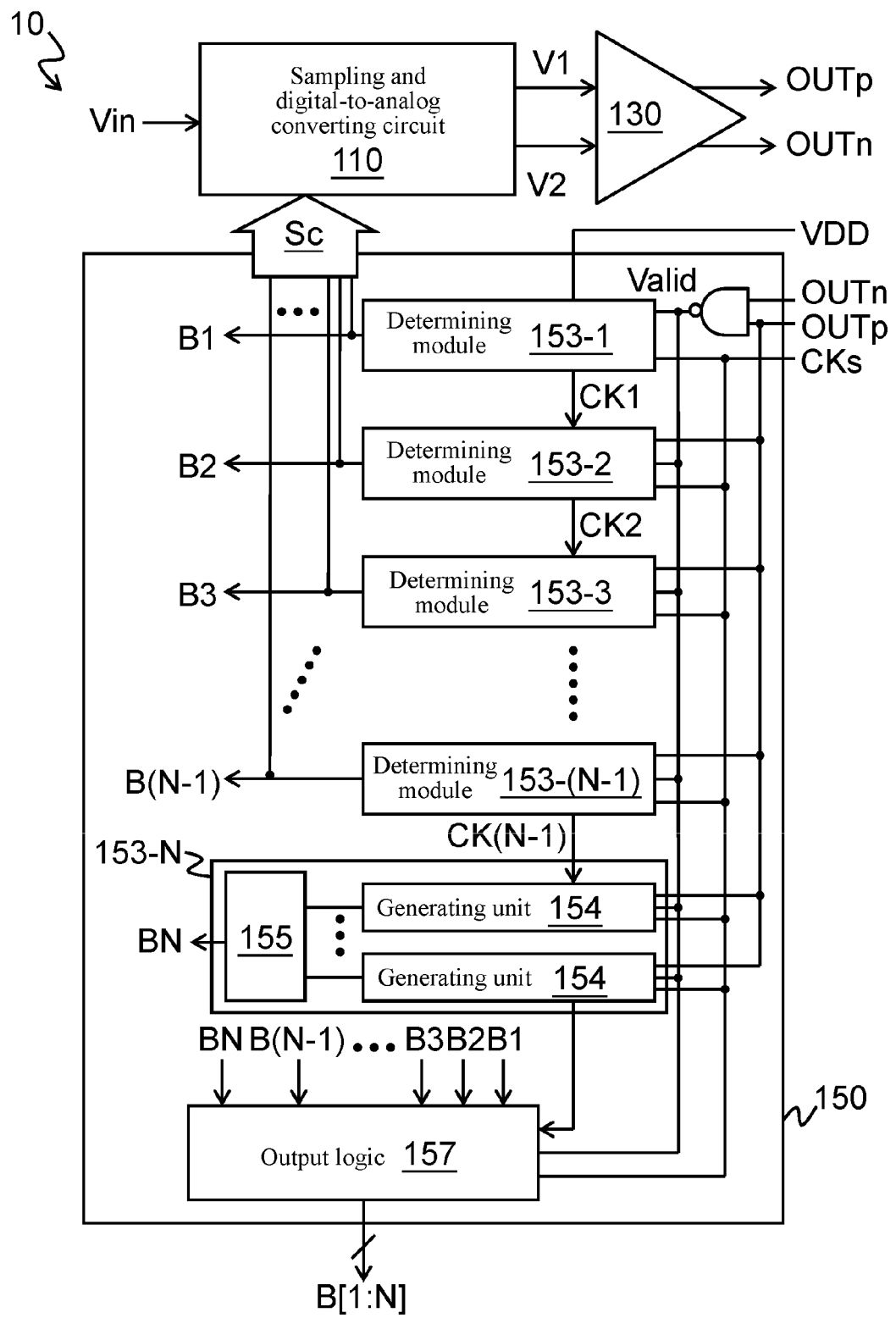
FIG. 1 is a schematic diagram of an SAR ADC according to an embodiment of the present invention.
Figure 2:
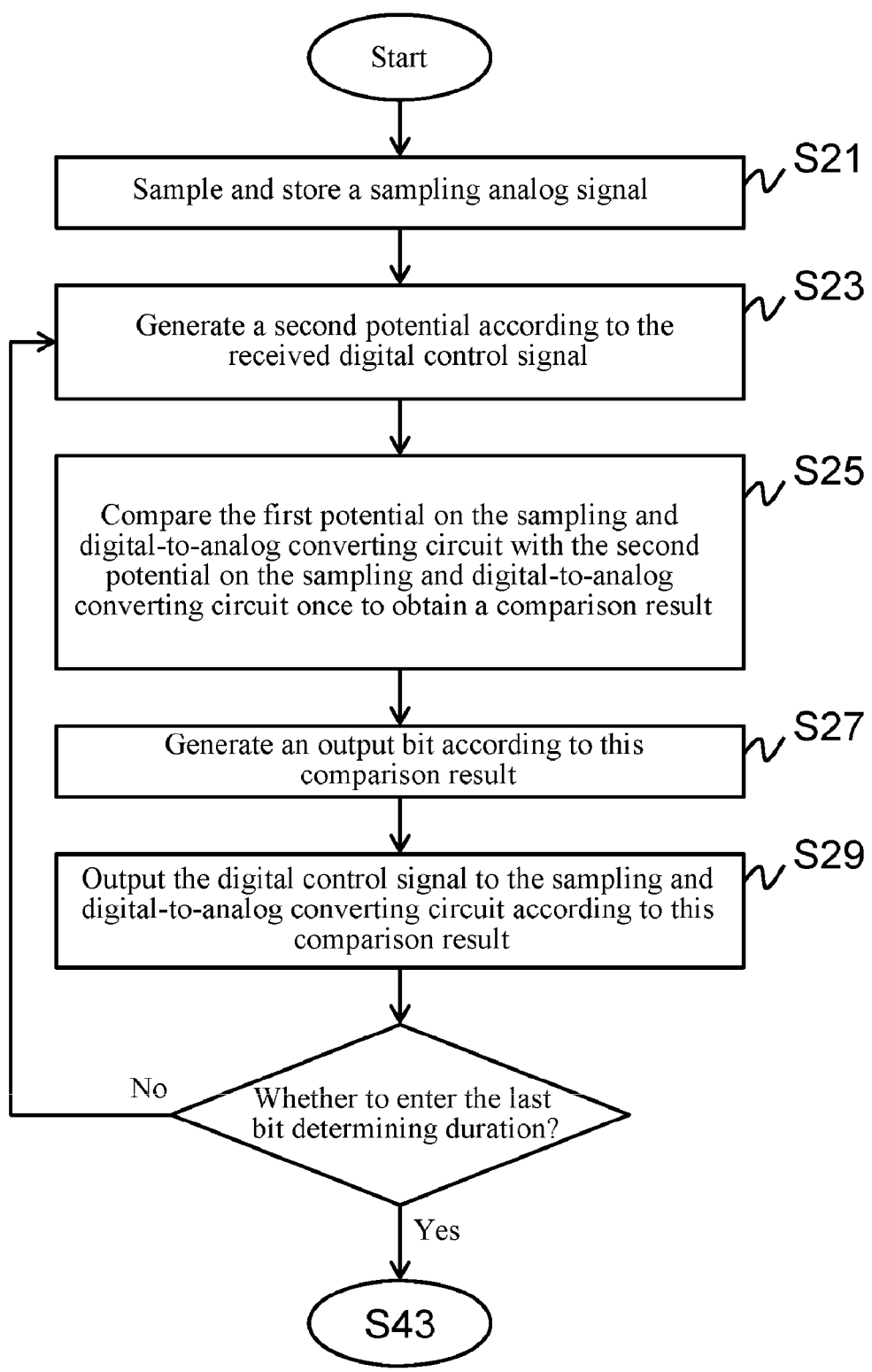
FIG. 2 and FIG. 3 are a schematic flow chart of an SAR analog-to-digital converting method according to an embodiment of the present invention.
Figure 3:
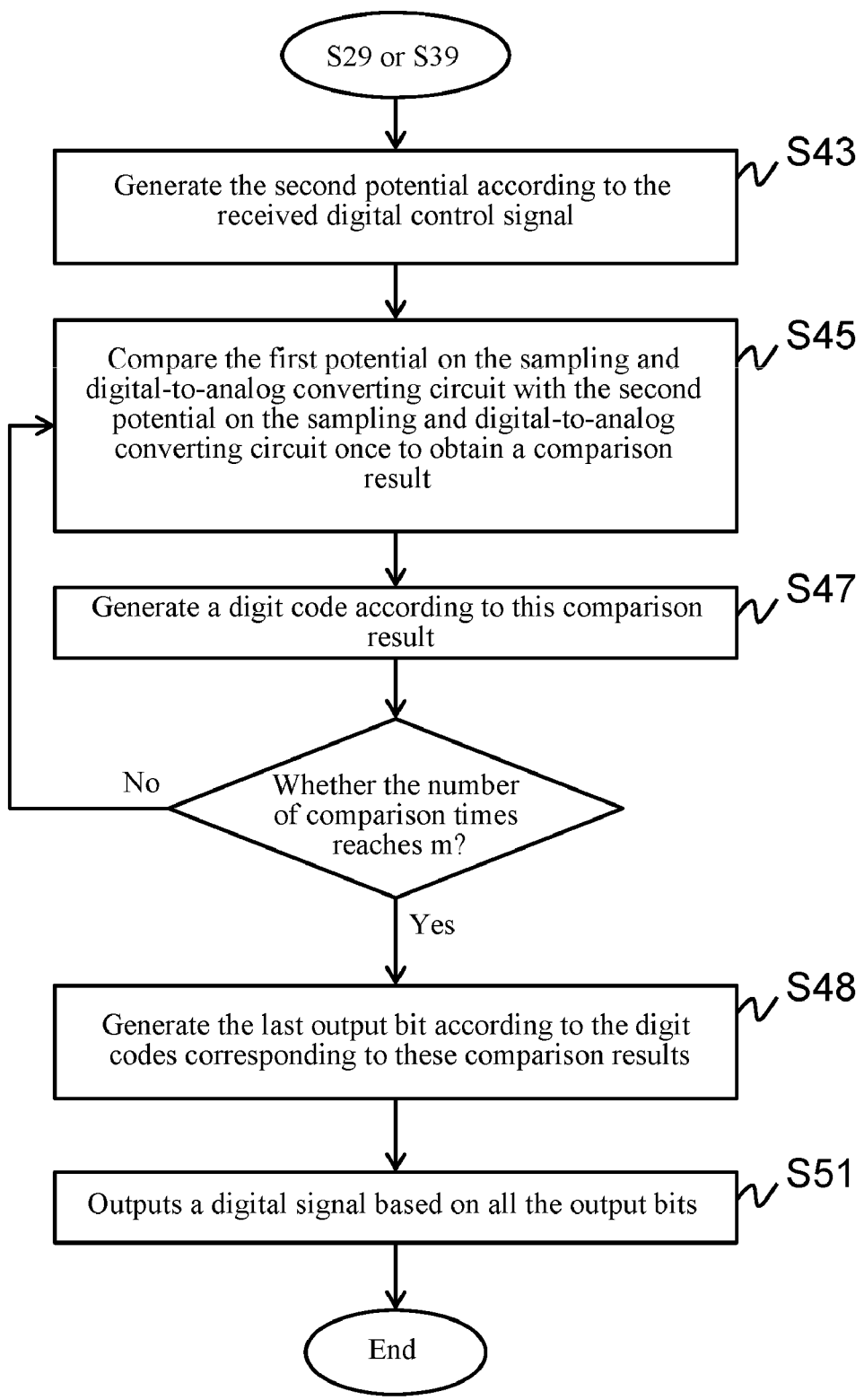

FIG. 1 is a schematic diagram of an SAR ADC according to an embodiment of the present invention. FIG. 2 and FIG. 3 are a schematic flow chart of an SAR analog-to-digital converting method according to an embodiment of the present invention.

Please refer to FIG. 1, in which an SAR ADC 10 includes a sampling and digital-to-analog converting circuit 110, a comparer 130 and an SAR control circuit 150.

The sampling and digital-to-analog converting circuit 110 is coupled to two input ends of the comparer 130, an output end of the comparer 130 is coupled to the SAR control circuit 150, and the SAR control circuit 150 is coupled to a control end of the sampling and digital-to-analog converting circuit 110.

Please refer to FIG. 2, in which the operating of the SAR ADC 10 starts from a sampling phase. During the sampling phase, the SAR control circuit 150 controls the sampling and digital-to-analog converting circuit 110 through a digital control signal Sc, so that the sampling and digital-to-analog converting circuit 110 samples and stores a sampling analog signal Vin (step S21). In other words, the sampling and digital-to-analog converting circuit 110 generates a first potential V1 by sampling the analog signal Vin.

Next, the SAR ADC 10 enters a bit-cycling phase, namely, a converting phase, so as to determine a converting output of a digital output. The bit-cycling phase includes N bit determining durations connected sequentially. N is an integer greater than 1. In each bit determining duration, the sampling and digital-to-analog converting circuit 110 converts a bit and generates a second potential V2. Here, the sampling and digital-to-analog converting circuit 110 only converts a bit in a same bit determining duration, and begins to convert a most significant bit (MSB) into an LSB.

In some embodiments, the SAR control circuit 150 includes N determining modules 153-1 to 153-N and an output logic 157.

The determining modules 153-1 to 153-(N−1) are individually coupled between the output end of the comparer 130 and the control end of the sampling and digital-to-analog converting circuit 110. Furthermore, output ends of the determining modules 153-1 to 153-(N−1) are connected to the output logic 157. Each of the determining modules 153-1 to 153-(N−1) is coupled to a next determining module.

The N determining modules 153-1 to 153-N are respectively corresponding to the N bit determining durations, and in each bit determining duration, the corresponding determining module determines an output bit according to outputs OUT_p and OUT_n of the comparer 130.

For convenience of description, the determining module 153-N is referred to as a first determining module 153-N, and the rest determining modules 153-1 to 153-(N−1) are referred to as second determining modules 153-1 to 153-(N−1) below.

In the first bit determining duration, the SAR control circuit 150 outputs the digital control signal Sc to the sampling and digital-to-analog converting circuit 110. In some embodiments, the SAR control circuit 150 generates the digital control signal Sc according to the outputs (namely, output bits B1 to B(N−1)) of the second determining modules 153-1 to 153-(N−1).

The sampling and digital-to-analog converting circuit 110 then generates the second potential V2 according to the received digital control signal Sc (step S23). Here, the highest (the first) bit of the digital control signal Sc is "1", and the rest bits are "0".

Next, the comparer 130 compares the first potential V1 on the sampling and digital-to-analog converting circuit 110 with the second potential V2 on the sampling and digital-to-analog converting circuit 110 once to obtain a first comparison result OUT_p and OUT_n (step S25). Here, the comparison result OUT_p and OUT_n is a differential signal.

The second determining module 153-1 generates an output bit B1 according to this comparison result OUT_p and OUT_n (step S27). For example, it is assumed that the first potential V1 is the input signal Vin, and the second potential V2 is an analog output ($V_{DAC}$) obtained after the digital control signal Sc is converted. At this time, when the comparison result OUT_p and OUT_n of the comparer 130 is that the analog output $V_{DAC}$ is less than the input signal Vin, the second determining module 153-1 sets the value of the output bit B1 to "1", namely, the first bit of the output signal B[1:N] is 1. On the contrary, when the comparison result OUT_p and OUT_n of the comparer 130 is that the analog output $V_{DAC}$ is greater than or equal to the input signal Vin, the second determining module 153-1 sets the output bit B1 to "0", namely, the first bit of the output signal B[1:N] is 0.

Furthermore, the SAR control circuit 150 controls the sampling and digital-to-analog converting circuit 110 according to this comparison result OUT_p and OUT_n (step S29), so as to adjust the second potential V2 on the sampling and digital-to-analog converting circuit 110. In other words, the SAR control circuit 150 performs adjustment according to the output bit B1 generated by the second determining module 153-1 and outputs a new digital control signal Sc to the sampling and digital-to-analog converting circuit 110, so that the sampling and digital-to-analog converting circuit 110 generates the second potential V2 according to the new digital control signal Sc (step S23). Taking that the first comparison result OUT_p and OUT_n is that the analog output $V_{DAC}$ is less than the input signal Vin as an example, at this time, the highest (the first), bit of the digital control signal Sc is maintained to be "1", the second highest (the second), bit is set from "0" to "1", and the remaining bits are also maintained to be "0". The sampling and digital-to-analog converting circuit 110 generates the second potential V2 according to the new digital control signal Sc. Similarly, if that the first comparison result OUT_p and OUT_n is that the analog output $V_{DAC}$ is not less than the input signal Vin is taken as an example, the highest (the first), bit of the digital control signal Sc is set to "0", the second highest (the second), bit is set from "0" to "1", and the rest bits are also maintained to be "0".

The comparer 130 again compares the first potential V1 on the sampling and digital-to-analog converting circuit 110 with the second potential V2 on the sampling and digital-to-analog converting circuit 110 once to obtain a second comparison result OUT_p and OUT_n (step S25).

The second determining module 153-1 Next generates (sets), a corresponding output bit B2 according to this comparison result OUT_p and OUT_n, namely, the second bit of the output signal B[1:N] (step S27).

Furthermore, the SAR control circuit 150 again controls the sampling and digital-to-analog converting circuit 110 according to this comparison result OUT_p and OUT_n (step S29), so as to again adjust the second potential V2 on the sampling and digital-to-analog converting circuit 110.

That is to say, (step S23), (step S25), (step S27), and (step S29), are executed repetitively and sequentially, until the last but one bit determining duration is completed. At this time, the second determining modules 153-1 to 153-(N−1) have respectively generated (set) the output bits B1 to B(N−1), namely, the first bit to the (N−1)th bit of the output signal B[1:N].

In the Nth bit determining duration (namely, the last bit determining duration), the comparer 130 repetitively compares the first potential V1 with the second potential V2 to obtain a plurality of comparison results OUT_p and OUT_n, namely, consecutively compares the first potential V1 with the second potential V2 a plurality of times. For convenience of description, the comparison result OUT_p and OUT_n generated in the Nth bit determining duration are referred to as a first comparison result OUT_p and OUT_n, and the comparison result OUT_p and OUT_n generated in the rest bit determining durations is referred to as a second comparison result OUT_p and OUT_n. In other words, in the last bit determining duration, the comparer 130 consecutively performs comparison m times and obtains m first comparison results OUT_p and OUT_n. Here, m is an integer greater than 1. in the last bit determining duration, after the comparer 130 completes the comparison, the SAR control circuit 150 does not control the sampling and digital-to-analog converting circuit 110 according to the comparison result OUT_p and OUT_n obtained each time to adjust the second potential V2 on the sampling and digital-to-analog converting circuit 110. That is to say, in the last bit determining duration, the SAR control circuit 150 does not change the output digital control signal Sc, so that the second potential V2 used when comparison is performed a plurality of times is maintained invariable.

In other words, in a same bit-cycling phase, the first determining module consecutively processes a plurality of comparison results, while the second determining module only processes one comparison result.

In some embodiments, the first determining module 153-N includes m generating units 154 and a judging unit 155. The m generating units 154 are individually coupled between the output end of the comparer 130 and the input end of the judging unit 155.

The m generating units are respectively corresponding to m first comparison results OUT_p and OUT_n, and generate a corresponding digit code according to a corresponding first comparison result OUT_p and OUT_n.

Figure 4:
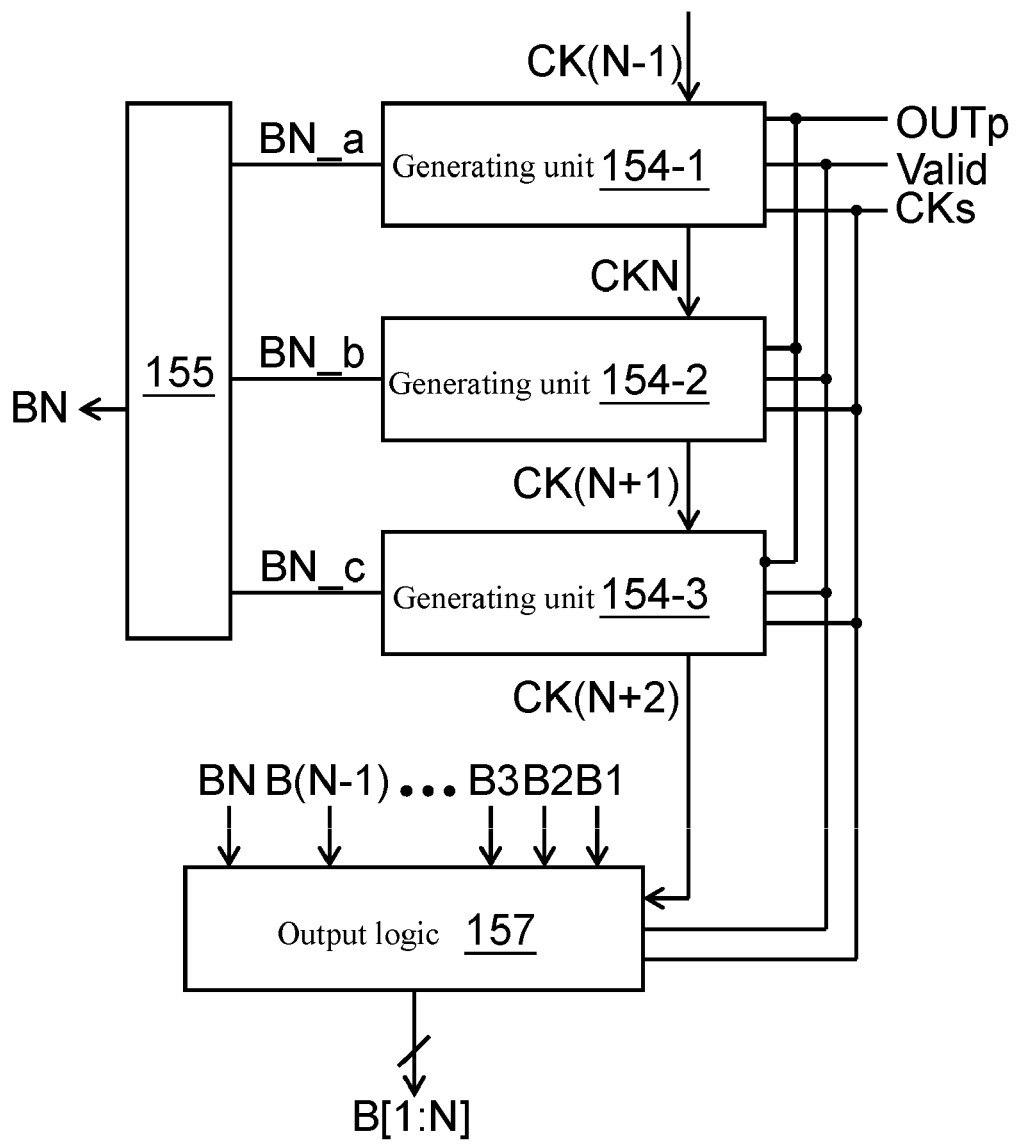
FIG. 4 is a schematic diagram of an embodiment of a first determining module in FIG. 1.

FIG. 4 is a schematic diagram of an embodiment of a first determining module 153-N in FIG. 1.

Taking that comparison performed consecutively thrice (namely, m=3) as an example, please refer to FIG. 3 and FIG. 4 collaboratively, the first determining module 153-N includes three generating units 154-1, 154-2, and 154-3 and a judging unit 155. The generating units 154-1, 154-2, and 154-3 are individually coupled between the output end of the comparer 130 and the input end of the judging unit 155. The output end of the judging unit 155 is connected to the control end of the sampling and digital-to-analog converting circuit 110 and the output logic 157.

In the Nth bit determining duration, the sampling and digital-to-analog converting circuit 110 generates the second potential V2 according to the new digital control signal Sc (step S43). Next, the comparer 130 performs first comparison (the Nth comparison of the entire bit-cycling phase), namely, compares the first potential V1 with the second potential V2 to obtain a first comparison result OUT_p and OUT_n (step S45). The generating unit 154-1 generates a digit code B3_a according to this first comparison result OUT_p and OUT_n (step S47).

Next, the comparer 130 performs second comparison (the (N+1)th comparison of the entire bit-cycling phase), namely, compares the first potential V1 with the second potential V2 to obtain a second first comparison result OUT_p and OUT_n (step S45). The generating unit 154-2 then generates a digit code B3_b according to this first comparison result OUT_p and OUT_n (step S47).

Next, the comparer 130 performs third comparison (the (N+2)th comparison of the entire bit-cycling phase), namely, compares the first potential V1 with the second potential V2 to obtain a third first comparison result OUT_p and OUT_n (step S45). The generating unit 154-3 then generates a digit code B3_c according to this first comparison result OUT_p and OUT_n (step S47).

After the set number of comparison times is completed, the judging unit 155 generates (sets) the last output bit BN according to the digit codes B3_a, B3_b, and B3_c corresponding to these three first comparison results OUT_p and OUT_n (step S48).

Next, the output logic 157 uses all the set output bits B1 to BN as a digital signal B[1:N], and outputs this digital signal B[1:N] to a next-stage circuit (step S51).

Figure 5:
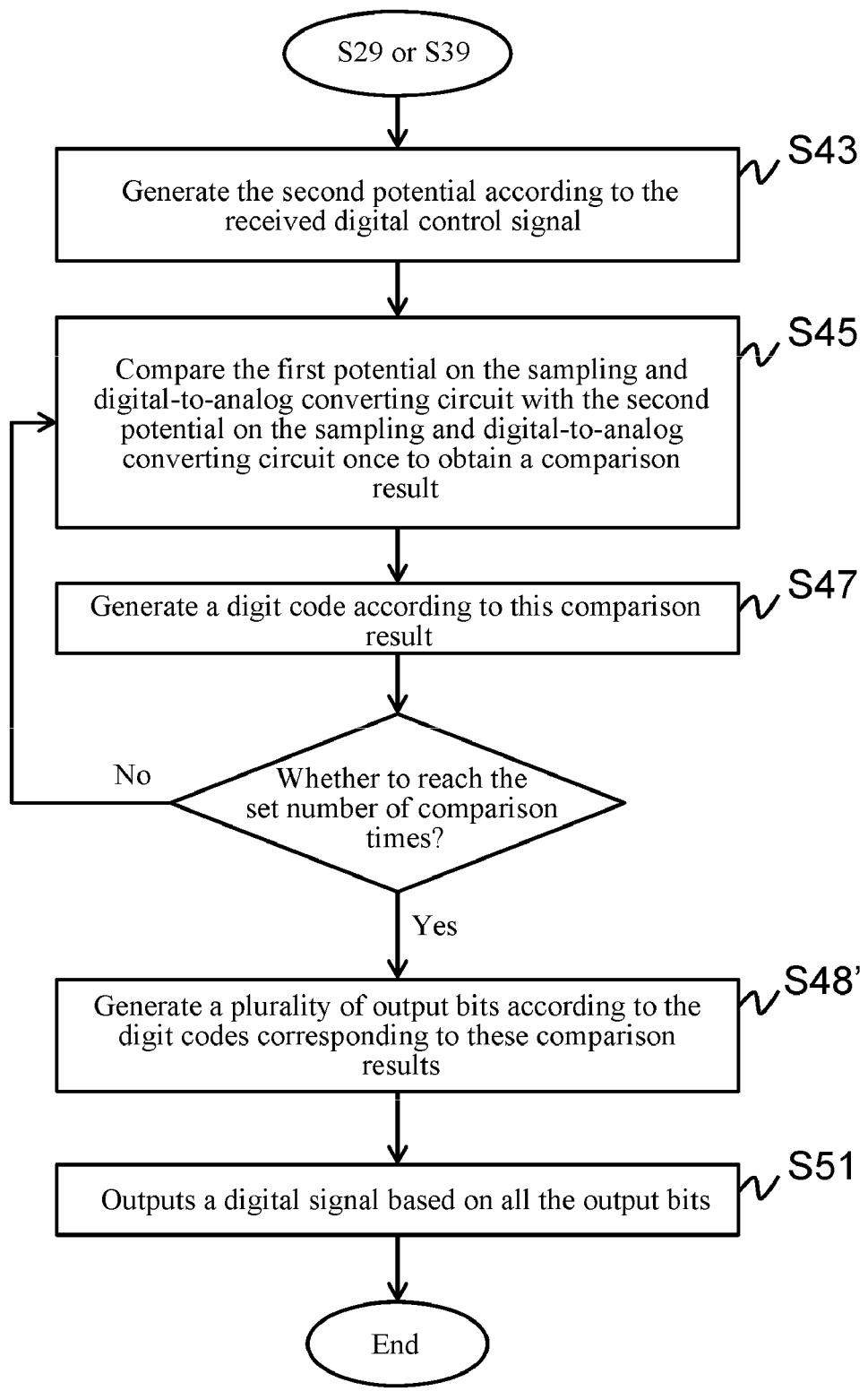
FIG. 5 is a partial flow chart of an SAR analog-to-digital converting method according to another embodiment of the present invention.
Figure 6:
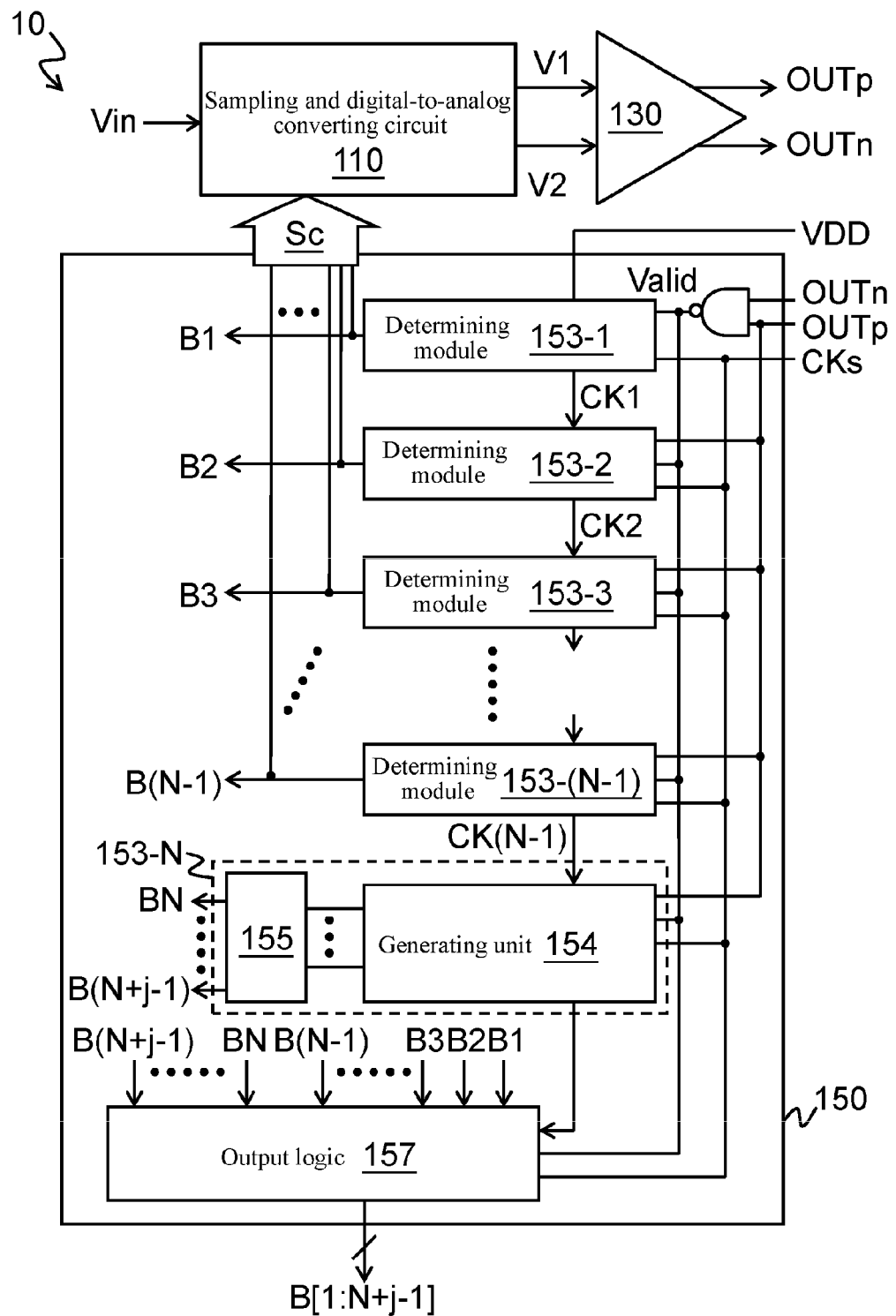
FIG. 6 is a schematic diagram of an SAR ADC according to another embodiment of the present invention.

FIG. 5 is a partial flow chart of an SAR analog-to-digital converting method according to another embodiment of the present invention. FIG. 6 is a schematic diagram of an SAR ADC according to another embodiment of the present invention.

In some embodiments, please refer to FIG. 5 and FIG. 6, in which the first determining module 153-N may generate a plurality of output bits BN to B(N+j−1) according to digit codes of m first comparison results OUT_p and OUT_n (step S48'). j is an integer greater than 1.

At this time, the output logic 157 uses all the output bits B1 to B(N+j−1) as a digital signal B[1:N+j−1], and outputs this digital signal B[1:N+j−1] to a next stage (step S51).

Figure 7:
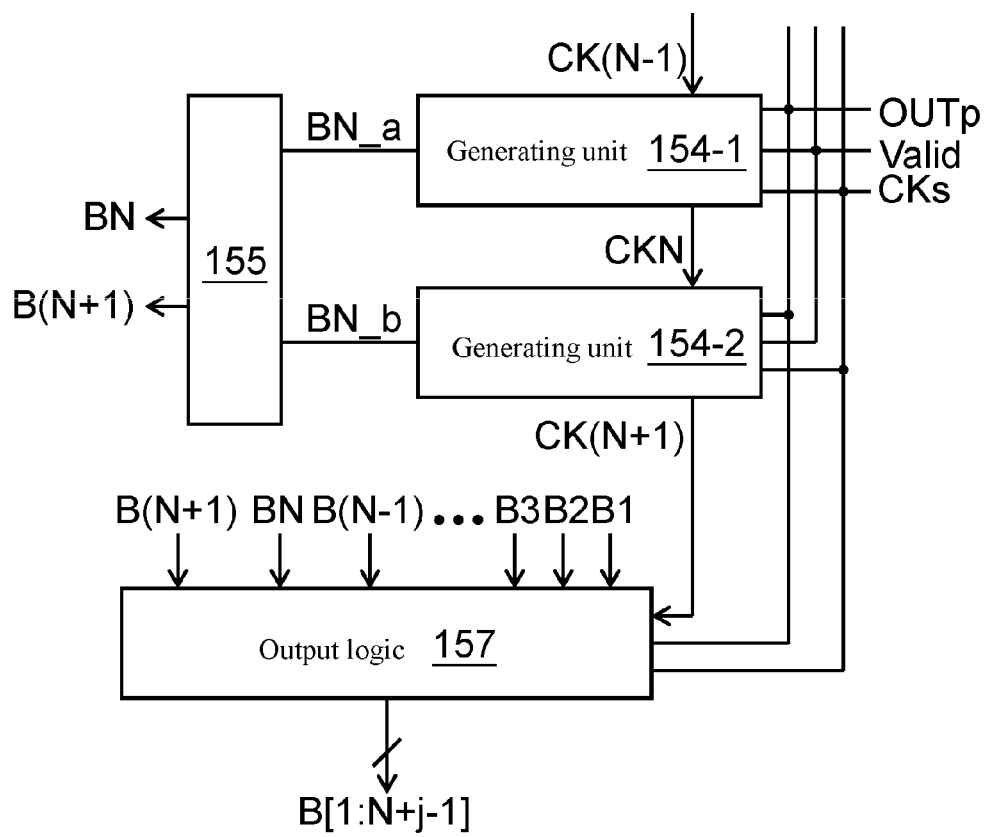
FIG. 7 is a schematic diagram of an embodiment of a first determining module in FIG. 6.

FIG. 7 is a schematic diagram of an embodiment of a first determining module 153-N in FIG. 6.

Taking that comparison performed consecutively twice and in which two output bits are generated as an example, please refer to FIG. 7 collaboratively, in which the first determining module 153-N includes two generating units 154-1 and 154-2, and a judging unit 155. The generating units 154-1 and 154-2 are individually coupled between the output end of the comparer 130 and the input end of the judging unit 155. The output end of the judging unit 155 is connected to the control end of the sampling and digital-to-analog converting circuit 110 and the output logic 157.

In the Nth bit determining duration, the comparer 130 consecutively performs comparison twice (the Nth comparison and the (N+1)th comparison of the entire bit-cycling phase), and sequentially obtains two first comparison results OUT_p and OUT_n. The generating unit 154-1 generates a digit code B3_a according to the first comparison result OUT_p and OUT_n, and the generating unit 154-2 generates a digit code B3_b according to the second first comparison result OUT_p and OUT_n (step S47). Next, the judging unit 155 may obtain the last two output bits BN and B(N+1) according to the digit codes BN_a and BN_b by using a conversion table (Table 1 shown below) (step S48').

TABLE 1

| BN_a | BN_b | BN | B(N+1) |
|---|---|---|---|
| 0 | 0 | 0 | 0 |
| 0 | 1 | 0 | 1 |

TABLE 1-continued

| BN_a | BN_b | BN | B(N + 1) |
|------|------|----|----------|
| 1    | 0    | 0  | 1        |
| 1    | 1    | 1  | 0        |

In some embodiments, in each of the last several bit determining durations, the comparer 130 consecutively performs comparison a plurality of times, thereby further enhancing the SNR of the SAR ADC 10.

In other words, each of the determining modules 153-(N−k−1) to 153-N corresponding to the last but k+1 bit determining duration to the Nth bit determining duration includes a plurality of generating units 154 and a judging unit 155. For convenience of description, the determining module 153-N is referred to as a first determining module 153-N, the determining modules 153-(N−k−1) to 153-(N−1) are referred to as third determining modules 153-(N−k−1) to 153-(N−1), and the rest determining modules 153-1 to 153-(N−k−2) are referred to as second determining modules 153-1 to 153-(N−k−2) below. Furthermore, the comparison result OUT_p and OUT_n generated in the Nth bit determining duration is referred to as a first comparison result OUT_p and OUT_n, the comparison result OUT_p and OUT_n generated in the last but k+1 bit determining duration to the (N−1)th bit determining duration is referred to as a third comparison result OUT_p and OUT_n, and the comparison result OUT_p and OUT_n generated in the rest bit determining durations is referred to as a second comparison result OUT_p and OUT_n below.

Figure 8:
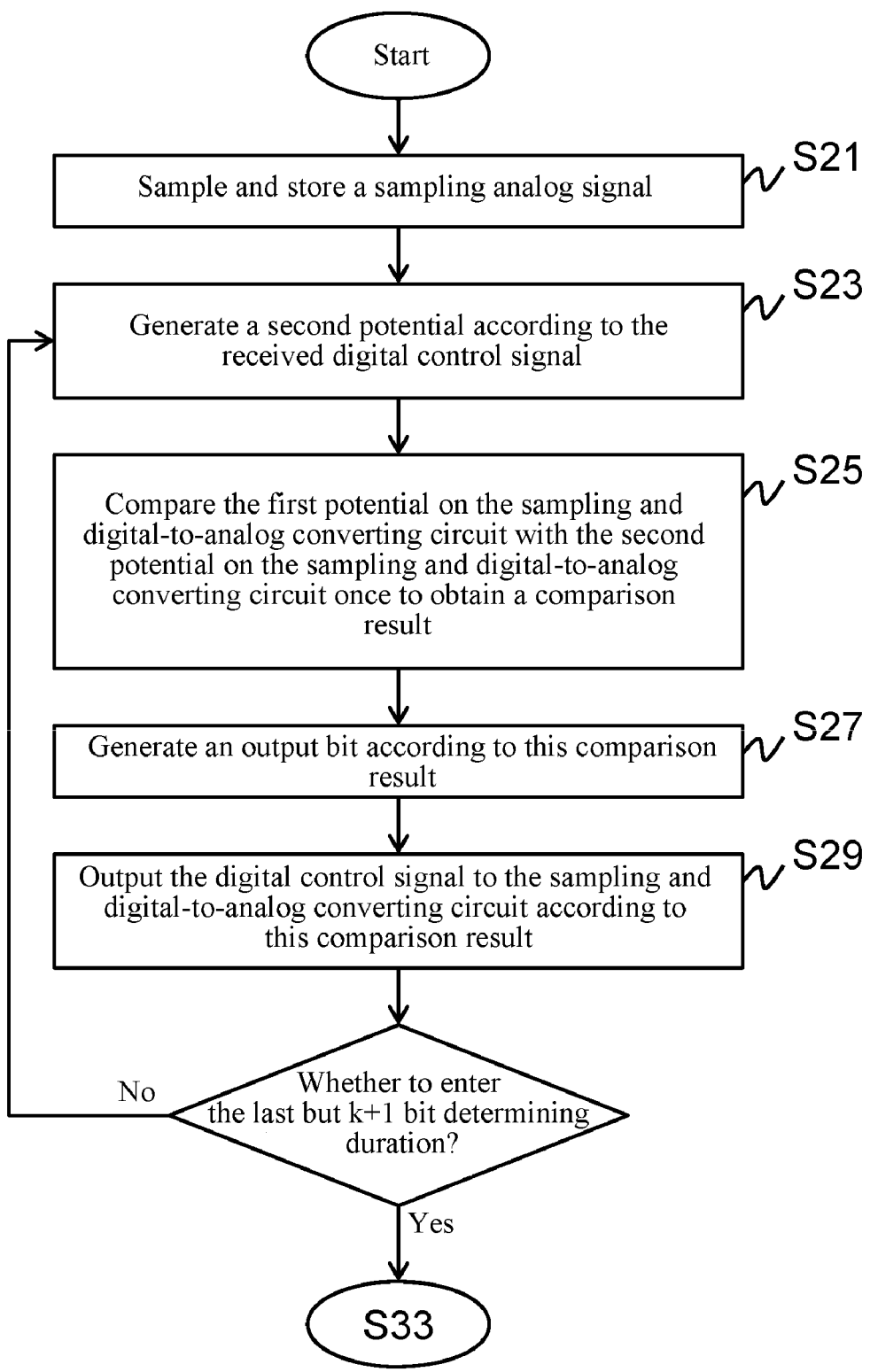
FIG. 8 and FIG. 9 are a partial flow chart of an SAR analog-to-digital converting method according to still another embodiment of the present invention.
Figure 9:
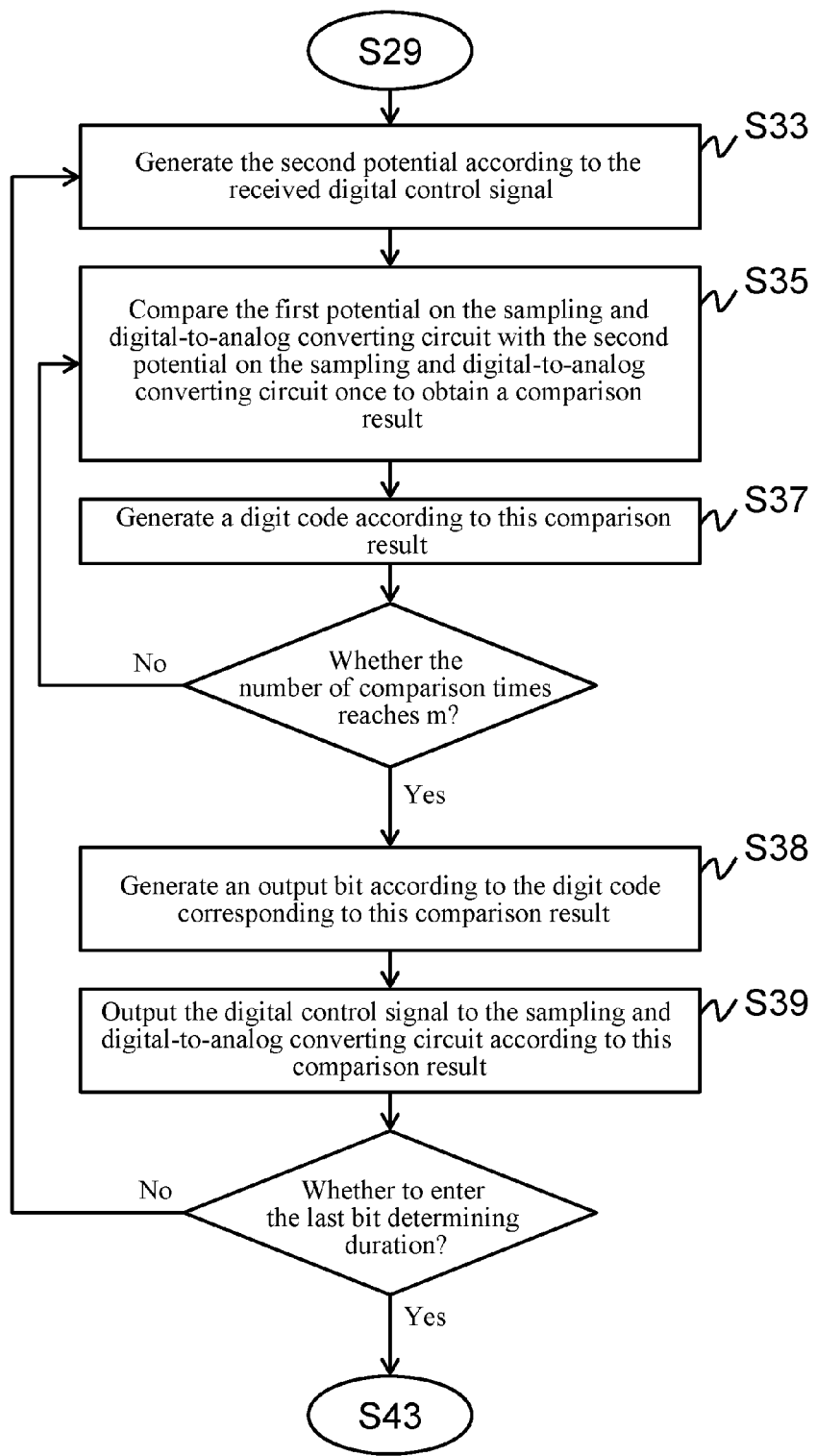
Figure 10:
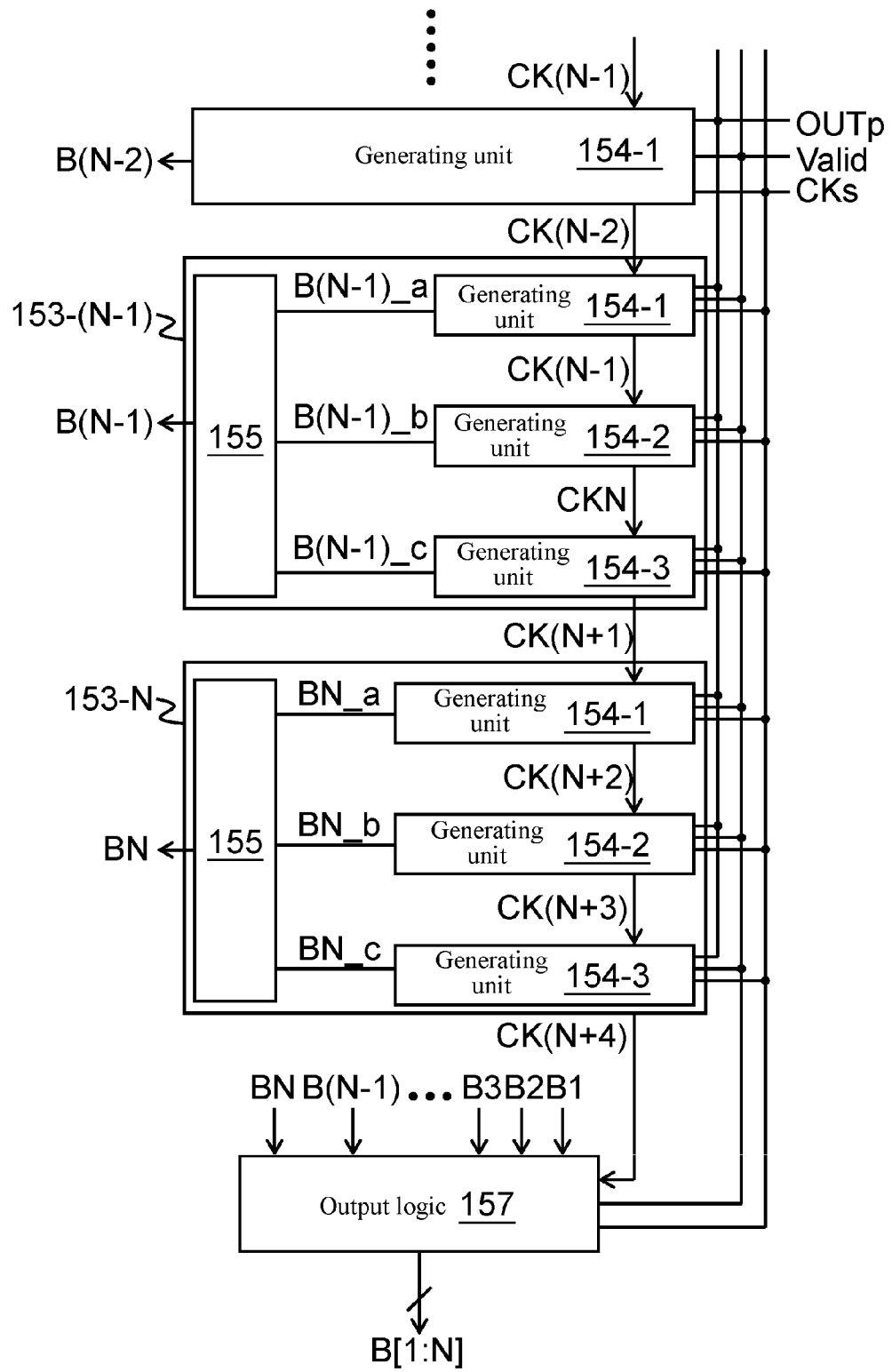
FIG. 10 is a locally schematic diagram of another embodiment of an SAR control circuit in FIG. 1.

FIG. 8 and FIG. 9 are a partial flow chart of an SAR analog-to-digital converting method according to still another embodiment of the present invention. In the drawings, k is an integer, and k+2 is less than the total sum of output bits. FIG. 10 is a locally schematic diagram of another embodiment of an SAR control circuit 150 in FIG. 1.

Please refer to FIG. 8, FIG. 9 and FIG. 10, in which it is assumed that the SAR ADC 10 is designed into that in the last two bit determining durations (namely, k=0 in the drawings), the comparer 130 individually performs comparison thrice (namely, m=0 in the drawings).

In the last but one bit determining duration (namely, the (N−1)th bit determining duration), the sampling and digital-to-analog converting circuit 110 generates the second potential V2 according to the new digital control signal Sc (step S33). Next, the comparer 130 performs first comparison in the (N−1)th bit determining duration, namely, compares the first potential V1 with the second potential V2 to obtain a third comparison result OUT_p and OUT_n (step S35). The generating unit 154-1 in the third determining module 153-(N−1) generates a digit code B(N−1)_a according to this third comparison result OUT_p and OUT_n (step S37).

Next, the comparer 130 again performs second comparison in the (N−1)th bit determining duration, namely, compares the first potential V1 with the second potential V2 to again obtain a third comparison result OUT_p and OUT_n (step S35). The generating unit 154-1 in the third determining module 153-(N−1) generates a digit code B(N−2)_b according to this third comparison result OUT_p and OUT_n (step S37).

Next, the comparer 130 again performs third comparison in the (N−1)th bit determining duration, namely, compares the first potential V1 with the second potential V2 to again obtain a third comparison result OUT_p and OUT_n (step S35). The generating unit 154-1 in the third determining module 153-(N−1) generates a digit code B(N−3)_c according to this third comparison result OUT_p and OUT_n (step S37).

Before the number of comparison times set in this bit determining duration is completed, the SAR control circuit 150 does not change the output digital control signal Sc, so that the second potential V2 used when comparison is performed a plurality of times is maintained invariable.

After the set number of comparison times is completed, the judging unit 155 in the third determining module 153-(N−1) generates (sets) the (N−1)th output bit B(N−1) according to the digit codes B(N−1)_a, B(N−1)_b, and B(N−1)_c corresponding to the third comparison results OUT_p and OUT_n generated after comparison is performed thrice (step S38).

The SAR control circuit 150 again controls the sampling and digital-to-analog converting circuit 110 according to these third comparison results OUT_p and OUT_n (step S39), so as to again adjust the second potential V2 on the sampling and digital-to-analog converting circuit 110 (step 43). In other words, the SAR control circuit 150 performs adjustment based on the (N−1)th output bit B(N−1) set by the judging unit 155 in the third determining module 153-(N−1) and outputs the digital control signal Sc to the sampling and digital-to-analog converting circuit 110.

In the Nth bit determining duration, please refer to FIG. 3 or FIG. 5 collaboratively, in which after the sampling and digital-to-analog converting circuit 110 adjusts the second potential V2 according to the new digital control signal Sc (step 43), the comparer 130 consecutively compares the first potential V1 with the second potential V2 thrice, so as to obtain three first comparison results OUT_p and OUT_n (step 45). Furthermore, the generating units 154-1, 154-2, and 154-3 in the first determining module 153-N generate digit codes BN_a, BN_b, and BN_c according to these first comparison results OUT_p and OUT_n respectively (step 47). Next, the judging unit 155 in the third determining module 153-N generates (sets) the Nth output bit BN (step S48) or generates the Nth and (N+1)th output bits BN and B(N+1) (step S48') according to the digit codes BN_a, BN_b, and BN_c corresponding to the first comparison results OUT_p and OUT_n generated after comparison is performed thrice.

In other words, in a same bit-cycling phase, both the first determining module and the third determining module process a plurality of comparison results, while the second determining module only processes one comparison result. Additionally, a plurality of generating units in a same determining module is respectively corresponding to a plurality of comparison results generated by a same bit determining duration. Furthermore, except for the last bit determining duration, for a bit determining duration in which comparison is performed a plurality of times, before the number of comparison times set in this bit determining duration is completed, the SAR control circuit 150 does not change the output digital control signal Sc, so that the second potential V2 used when comparison is performed a plurality of times is maintained invariable.

In some embodiments, when the comparer 130 consecutively performs comparison a plurality of times in each of the last several bit determining durations, the comparer 130 may execute comparison same times or different times in all the bit determining durations, or same times in part of the bit determining durations and different times in part of the bit determining durations. For example, it is assumed that in FIG. 8, k=0, the SAR ADC 10 may be designed the same as that in the aforementioned example. However, the SAR ADC 10 may also be designed into that the comparer 130 consecutively performs comparison twice in the (N−1)th bit determining duration (namely, the third determining module has two generating units), and consecutively performs comparison thrice in the Nth bit determining duration (namely, the first determining module has three generating units).

In step S38 or step S48, the judging unit 155 may obtain a corresponding output bit in a majority decision manner or in an averaging and round-off manner.

Taking the Nth bit determining duration and m=3 as an example, the judging unit 155 performs majority decision on the corresponding digit codes BN_a, BN_b, and BN_c to obtain the last output bit BN, as shown in Table 2 below.

TABLE 2

| BN_a | BN_b | BN_c | BN |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

In other words, when the majority decision manner is used, m must be an odd number, namely, the number of comparison times of the comparer 130 in this bit determining duration is an odd number.

Next, taking the Nth bit determining duration and m=3 as an example, the judging unit 155 performs averaging and round-off (round-off of the decimal place), on the corresponding digit codes BN_a, BN_b, and BN_c to obtain the last output bit BN, as shown in Table 3 below.

TABLE 3

| BN_a | BN_b | BN_c | Average | BN |
|---|---|---|---|---|
| 0 | 0 | 0 | 0 | 0 |
| 0 | 0 | 1 | 0.33 | 0 |
| 0 | 1 | 0 | 0.33 | 0 |
| 0 | 1 | 1 | 0.67 | 1 |
| 1 | 0 | 0 | 0.33 | 0 |
| 1 | 0 | 1 | 0.67 | 1 |
| 1 | 1 | 0 | 0.67 | 1 |
| 1 | 1 | 1 | 1 | 1 |

Figure 11:
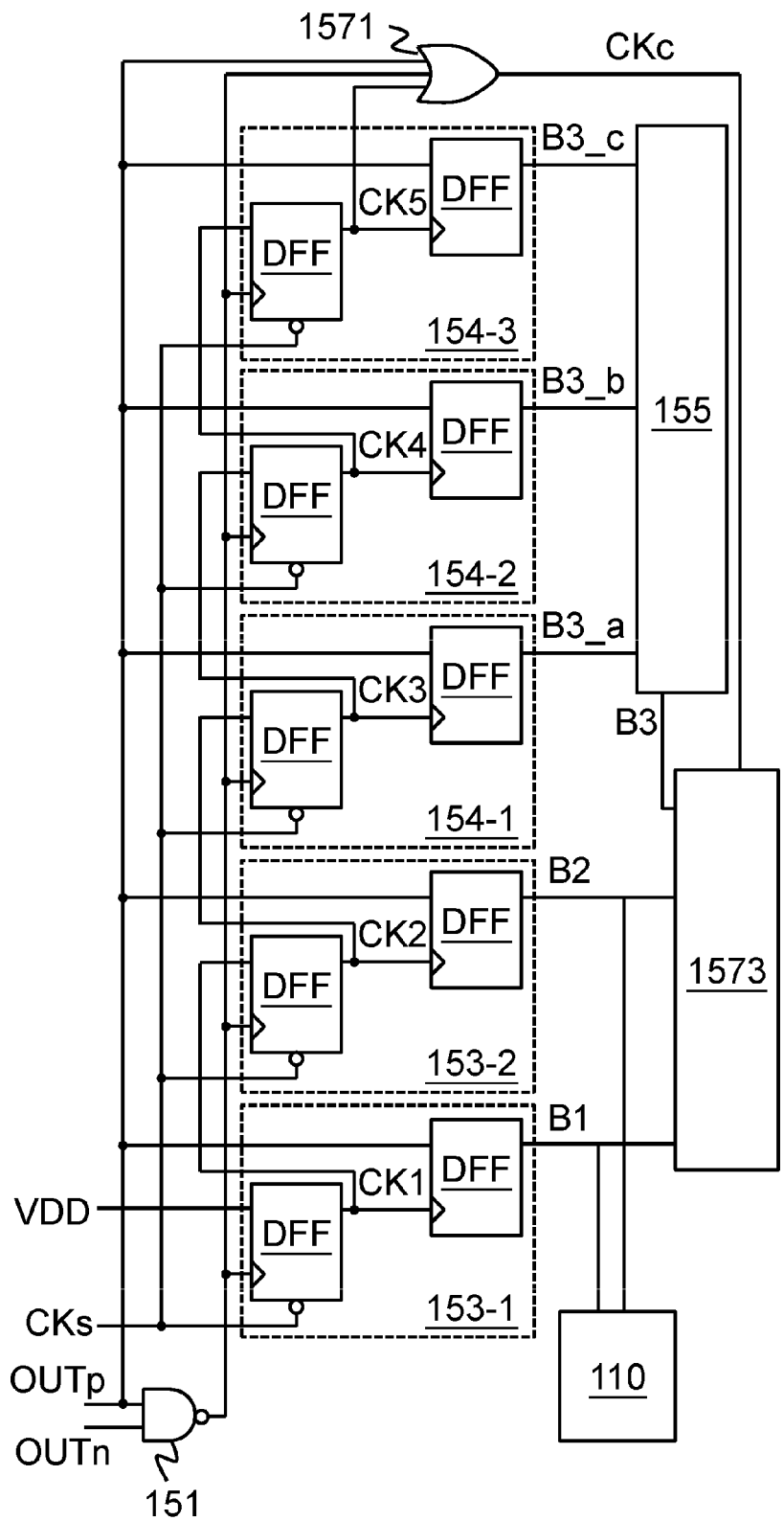
FIG. 11 is a locally schematic diagram of an SAR ADC according to another embodiment of the present invention.

FIG. 11 is a locally schematic diagram of an SAR ADC according to another embodiment of the present invention.

Taking N=3 as an example, please refer to FIG. 11, in which embodiment, in the first and second bit determining durations, the comparer 130 individually performs comparison once, while in the third bit determining duration, the comparer 130 performs comparison thrice.

The SAR control circuit 150 includes an input logic 151, second determining modules 153-1 and 153-2, a first determining module and an output logic. The first determining module includes three generating units 154-1, 154-2, and 154-3 and a judging unit 155. The output logic includes a logic element 1571 and an output unit 1573. Two input ends of the input logic 151 are coupled to a positive output end and a negative output end of the comparer 130.

The second determining modules 153-1 and 153-2 and the generating units 154-1, 154-2, and 154-3 may be implemented flip-flops DFF connected in series. Here, each of the second determining modules 153-1 and 153-2 and the generating units 154-1, 154-2, and 154-3 includes two flip-flops DFF (which are referred to as a first flip-flop DFF and a second flip-flop DFF respectively below for convenience of illustration).

The set end or reset end of the first flip-flop DFF in each of the second determining modules 153-1 and 153-2, and the generating units 154-1, 154-2, and 154-3 receives a system clock CKs, and performs setting or resetting according to the system clock CKs.

The output end of each first flip-flop DFF is coupled to the control end of the second flip-flop DFF of the corresponding same bit or same digit code and the input end of the first flip-flop DFF of the corresponding next bit or next digit code. The input end of the first flip-flop DFF of the second determining module 153-1 is coupled to the power supply end (supply voltage VDD).

In other words, the output end of the first flip-flop DFF of the second determining module 153-1 is coupled to the control end of the second flip-flop DFF of the second determining module 153-1 and the input end of the first flip-flop DFF of the second determining module 153-2. The output end of the first flip-flop DFF of the second determining module 153-2 is coupled to the control end of the second flip-flop DFF of the second determining module 153-2 and the input end of the first flip-flop DFF of the generating unit 154-1. The output end of the first flip-flop DFF of the generating unit 154-1 is coupled to the control end of the second flip-flop DFF of the generating unit 154-1 and the input end of the first flip-flop DFF of the generating unit 154-2. The output end of the first flip-flop DFF of the generating unit 154-3 is coupled to the control end of the second flip-flop DFF of the generating unit 154-3 and the first input end of the logic element 1571.

The input end of each second flip-flop DFF is coupled to the positive output end of the comparer 130. The output end of the second flip-flop DFF of each of the generating units 154-1, 154-2, and 154-3 is connected to the input end of the judging unit 155. The output end of the second flip-flop DFF of each of the second determining modules 153-1 and 153-2 and the output end of the judging unit 155 are coupled to the output end of the output unit 1573, and the output end of the second flip-flop DFF of each of the second determining modules 153-1 and 153-2 is electrically connected to the sampling and digital-to-analog converting circuit 110.

The output end of the input logic 151 is coupled to the control end of each first flip-flop DFF and the second input end of the logic element 1571. The third input end of the logic element 1571 receives the system clock CKs. The output end of the logic element 1571 is connected to the control end of the output unit 1573.

The input logic 151 receives the positive end output and the negative end output (the comparison result OUT_p and OUT_n), of the comparer 130, and performs a logic operation on the comparison result OUT_p and OUT_n to output a valid signal Valid to the control end of each first flip-flop DFF and the input end of the logic element 1571. In some embodiments, the input logic 151 may be a NAND gate.

The first flip-flop DFF of the second determining module 153-1 generates a clock signal CK1 according to the valid signal Valid and the supply voltage VDD. The second flip-flop DFF of the second determining module 153-1 then sets the first output bit B1 according to the positive end comparison result OUT_p and the clock signal CK1. Furthermore, the first flip-flop DFF of the second determining module 153-1 further provides this clock signal CK1 to the first flip-flop DFF of the second determining module 153-2, so as to be used as input data of the first flip-flop DFF of the second determining module 153-2.

The first flip-flop DFF of the second determining module 153-2 generates a clock signal CK2 according to the valid signal Valid and the clock signal CK1. The second flip-flop DFF of the second determining module 153-1 then sets the second output bit B2 according to the positive end comparison result OUT_p and the clock signal CK2. Furthermore, the first flip-flop DFF of the second determining module 153-2 further provides this clock signal CK2 to the first flip-flop DFF of the generating unit 154-1, so as to be used as input data of the first flip-flop DFF of the generating unit 154-1.

The generating unit 154-1 generates a clock signal CK3 according to the valid signal Valid and the clock signal CK2. The second flip-flop DFF of the generating unit 154-1 then outputs a digit code B3_a according to the positive end comparison result OUT_p and the clock signal CK3. Furthermore, the first flip-flop DFF of the generating unit 154-1 further provides this clock signal CK3 to the first flip-flop DFF of the generating unit 154-2, so as to be used as input data of the first flip-flop DFF of the generating unit 154-2.

The generating unit 154-2 generates a clock signal CK4 according to the valid signal Valid and the clock signal CK2. The second flip-flop DFF of the generating unit 154-2 then outputs a digit code B3_b according to the positive end comparison result OUT_p and the clock signal CK4. Furthermore, the first flip-flop DFF of the generating unit 154-2 further provides this clock signal CK4 to the first flip-flop DFF of the generating unit 154-3, so as to be used as input data of the first flip-flop DFF of the generating unit 154-3.

The generating unit 154-3 generates a clock signal CK5 according to the valid signal Valid and the clock signal CK4. The second flip-flop DFF of the generating unit 154-3 then outputs a digit code B3_c according to the positive end comparison result OUT_p and the clock signal CK5. Furthermore, the first flip-flop DFF of the generating unit 154-1 further provides this clock signal CK5 to the logic element 1571.

The judging unit 155 sets the third output bit B3 according to the digit codes B3_a, B3_b, and B3_c. Here, the judging unit 155 may determine the third output bit B3 in a majority decision manner or in an averaging and round-off manner.

The logic element 1571 generates a control clock CKc according to the system clock CKs, the valid signal Valid and the clock signal CK5, so that the output unit 1573 reads the first output bit B1, the second output bit B2 and the third output bit B3 according to the control clock CKc, and outputs the first output bit B1, the second output bit B2 and the third output bit B3 as an output signal B[1:3]. In some embodiments, the logic element 1571 may be implemented through an OR gate.

Figure 12:
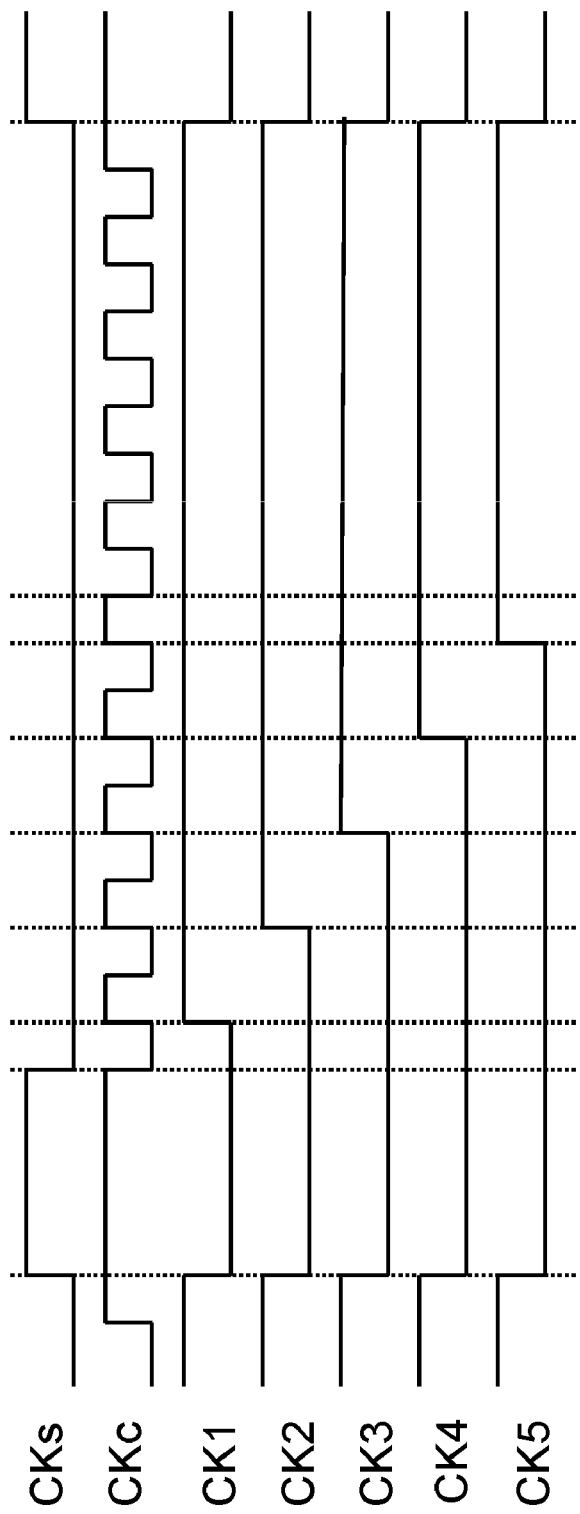
FIG. 12 is a timing diagram of an embodiment of a system clock, a clock signal and a control clock in FIG. 11.

In this embodiment, the timing relationship among the system clock CKs, the clock signals CK1 to CK5, and the control clock CKc is shown in FIG. 12.

The sampling and digital-to-analog converting circuit 110 basically includes a plurality of switches and a plurality of capacitors. A first end of each of these capacitors is connected to an input end of the comparer 130, and a second end thereof selectively receives a reference voltage through a switch. The SAR control circuit 150 is coupled to the control end of each of these switches, and determines the potential of the first end of each of these capacitors (such as, the second potential V2) by controlling the operating of these switches. In some embodiments, the sampling and digital-to-analog converting circuit 110 may include a sampling and storing circuit and a digital-to-analog converter or a capacitive digital-to-analog converter. The implementation aspect and the detailed operating of the sampling and digital-to-analog converting circuit are well known by persons skilled in the art, so no more details are given here.

To summarize, according to the SAR ADC and the method thereof of the present invention, the number of comparison times of the comparer is increased in last several bit determining durations, so under the situation that no complex signal detecting apparatus is added, the influence of a noise (such as: noise interference generated by the comparer, a chip system itself, or a power source), on the SNR of the SAR ADC is effectively reduced. Additionally, for results of a plurality of comparison times, the energy of the noise may be further reduced in a manner of majority decision, averaging and round-off or specific encoding.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A successive-approximation-register (SAR) analog-to-digital converting method, comprising:
generating a first potential by sampling an analog signal;
generating a plurality of output bits sequentially according to the first potential and a plurality of second potentials occurring consecutively on the digital-to-analog converting circuit by using a comparer, wherein the second potentials correspond to the output bits respectively; and
outputting a digital signal based on the output bits,
wherein a step of generating a last output bit of the output bits comprises:
comparing the first potential with a second potential occurring at the last time of the second potentials a plurality of times consecutively by using the comparer, so as to obtain a plurality of first comparison results; and
generating the last output bit according to the first comparison results.

2. The SAR analog-to-digital converting method according to claim 1, wherein the step of generating the last output bit according to the first comparison results comprises:
generating a plurality of digit codes respectively according to the first comparison results of the comparer; and
performing majority decision on the digit codes to obtain the last output bit.

3. The SAR analog-to-digital converting method according to claim 1, wherein the step of generating the corresponding last output bit according to the first comparison results comprises:
generating a plurality of digit codes respectively according to the first comparison results of the comparer; and
performing averaging and round-off on the digit codes to obtain the last output bit.

4. The SAR analog-to-digital converting method according to claim 1, wherein a step of generating each output bit of the last but one output bit to the last but k−1 output bit of the output bits comprises:
comparing the first potential with the corresponding second potential a plurality of times consecutively by using the comparer, so as to obtain a plurality of third comparison results;
controlling the digital-to-analog converting circuit according to the third comparison results, so as to adjust the second potential on the digital-to-analog converting circuit; and
generating the corresponding output bit according to the third comparison results,
wherein k is an integer, and k+2 is less than the total sum of the output bits.

5. The SAR analog-to-digital converting method according to claim 4, wherein the step of generating the corresponding output bit according to the third comparison results comprises:
   generating a plurality of digit codes respectively according to the third comparison results; and
   performing majority decision on the digit codes to obtain the corresponding output bit.

6. The SAR analog-to-digital converting method according to claim 4, wherein the step of generating the corresponding output bit according to the third comparison results comprises:
   generating a plurality of digit codes respectively according to the third comparison results; and
   performing averaging and round-off on the digit codes to obtain the corresponding output bit.

7. The SAR analog-to-digital converting method according to claim 1, wherein a step of generating each output bit of the rest output bits of the output bits comprises:
   comparing the first potential with the corresponding second potential once by using the comparer, so as to obtain a second comparison result;
   controlling the digital-to-analog converting circuit according to the second comparison result of the comparer, so as to adjust the second potential on the digital-to-analog converting circuit; and
   generating the corresponding output bit according to the second comparison result.

8. A successive-approximation-register (SAR) analog-to-digital converting method, comprising:
   generating a first potential by sampling an analog signal;
   generating a plurality of output bits sequentially according to the first potential and a plurality of second potentials occurring consecutively on the digital-to-analog converting circuit by using a comparer; and
   outputting a digital signal based on the output bits,
   wherein a step of generating last j output bits of the output bits comprises:
      comparing the first potential with a second potential occurring at the last time of the second potentials a plurality of times consecutively by using the comparer, so as to obtain a plurality of first comparison results respectively; and
      generating the last j output bits according to the first comparison results of the comparer, wherein j is an integer greater than 1.

9. The SAR analog-to-digital converting method according to claim 8, wherein the step of generating the last j output bits according to the first comparison results comprises:
   generating at least three digit codes respectively according to the first comparison results; and
   determining the last j output bits according to the digit codes by using a conversion table.

10. The SAR analog-to-digital converting method according to claim 9, wherein a second potential occurring at the first time to a second potential occurring at the (j−1)th time of the second potentials correspond to the first output bit to the (j−1)th output bit of the output bits sequentially, a step of generating each output bit of the first output bit to the (j−1)th output bit comprises:
   comparing the first potential with the corresponding second potential once by using the comparer, so as to obtain a second comparison result;
   controlling the digital-to-analog converting circuit according to the second comparison result, so as to adjust the second potential on the digital-to-analog converting circuit; and
   generating the corresponding output bit according to the second comparison result.

11. The SAR analog-to-digital converting method according to claim 8, wherein a second potential occurring at the first time to a second potential occurring at the (j−1)th time of the second potentials correspond to the first output bit to the (j−1)th output bit of the output bits sequentially, a step of generating each output bit of the first output bit to the (j−1)th output bit comprises:
   comparing the first potential with the corresponding second potential once by using the comparer, so as to obtain a second comparison result;
   controlling the digital-to-analog converting circuit according to the second comparison result, so as to adjust the second potential on the digital-to-analog converting circuit; and
   generating the corresponding output bit according to the second comparison result.

12. A successive-approximation-register (SAR) analog-to-digital converter (ADC), comprising:
   a sampling and digital-to-analog converting circuit, used for generating a first potential by sampling an analog signal;
   a comparer, used for comparing the first potential with a second potential on the sampling and digital-to-analog converting circuit a plurality of times consecutively in a last bit determining duration of a plurality of bit determining durations to obtain a plurality of first comparison results respectively, and comparing the first potential with the second potential once individually in the rest bit determining durations to obtain a corresponding second comparison result; and
   an SAR control circuit, comprising:
      a first determining module, used for generating a group of last output bits according to the first comparison results in the last bit determining duration;
      at least one second determining module, wherein each second determining module is corresponding to one of the rest bit determining durations, generates an output bit according to the corresponding second comparison result in the corresponding bit determining duration, and controls the sampling and digital-to-analog converting circuit according to the corresponding second comparison result, so as to adjust the second potential on the sampling and digital-to-analog converting circuit; and
      an output logic, used for outputting a digital signal according to the at least one output bit and the group of last output bits.

13. The SAR ADC according to claim 12, wherein the bit number of the group of last output bits is a positive integer, and is less than or equal to the number of comparison times of the comparer.

14. The SAR ADC according to claim 12, wherein the group of last output bits is a last output bit, and the first determining module comprises:
   a plurality of generating units, corresponding to the first comparison results respectively, wherein each of the generating units is used for generating a digit code according to the corresponding first comparison result; and
   a judging unit, used for performing majority decision on the digit codes to obtain the last output bit.

15. The SAR ADC according to claim 12, wherein the group of last output bits is a last output bit, and the first determining module comprises:

a plurality of generating units, corresponding to the first comparison results respectively, wherein each of the generating units is used for generating a digit code according to the corresponding first comparison result; and a judging unit, used for performing averaging and round-off on the digit codes to obtain the last output bit.

16. The SAR ADC according to claim 12, wherein the group of last output bits is a plurality of last output bits, and the first determining module comprises:

a plurality of generating units, corresponding to the first comparison results respectively, wherein each of the generating units is used for generating a digit code according to the corresponding first comparison result; and a judging unit, used for outputting the last output bits according to the digit codes by using a conversion table.

17. The SAR ADC according to claim 12, wherein the comparer is further used for comparing the first potential with the second potential a plurality of times in each bit determining duration of the second bit determining duration to the kth bit determining duration to obtain a plurality of third comparison results individually, and the SAR control circuit further comprises:

at least one third determining module, corresponding to the last but one bit determining duration to the last but k−1 bit determining duration respectively, and generating a corresponding output bit according to the third comparison results of the comparer in the corresponding bit determining duration.

18. The SAR ADC according to claim 17, wherein each third determining module comprises:

a plurality of generating units, corresponding to the third comparison results generated in the same bit determining duration respectively, wherein each of the generating units is used for generating a digit code according to the corresponding third comparison result; and a judging unit, used for performing majority decision on the digit codes to obtain the corresponding output bit.

19. The SAR ADC according to claim 17, wherein each third determining module comprises:

a plurality of generating units, corresponding to the third comparison results generated in the same bit determining duration respectively, wherein each of the generating units is used for generating a digit code according to the corresponding third comparison result; and a judging unit, used for performing averaging and round-off on the digit codes to obtain the corresponding output bit.

* * * * *